United States Patent [19]
Ingram et al.

[11] Patent Number: 5,990,503
[45] Date of Patent: Nov. 23, 1999

[54] SELECTABLE RESOLUTION CCD SENSOR

[75] Inventors: Simon Gareth Ingram, Waterloo; Gareth Pryce Weale, New Hamburg; Nixon O., Waterloo, all of Canada

[73] Assignee: Dalsa, Inc., Canada

[21] Appl. No.: 09/250,649

[22] Filed: Feb. 16, 1999

Related U.S. Application Data

[63] Continuation-in-part of application No. 09/006,888, Jan. 14, 1998.

[51] Int. Cl.$^6$ .................... H01L 27/148; H01L 29/768
[52] U.S. Cl. ...................... 257/236; 257/241; 257/249; 257/250
[58] Field of Search ...................... 257/236, 241, 257/249, 250

[56] References Cited

U.S. PATENT DOCUMENTS

| | | |
|---|---|---|
| 4,280,141 | 7/1981 | McCann et al. . |
| 4,328,432 | 5/1982 | Yamazaki . |
| 4,382,267 | 5/1983 | Angle . |
| 4,426,664 | 1/1984 | Nagumo et al. . |
| 4,430,673 | 2/1984 | Salomon et al. . |
| 4,679,212 | 7/1987 | Hynecek . |
| 4,782,394 | 11/1988 | Hieda et al. . |
| 4,849,814 | 7/1989 | Van De Steeg . |
| 4,954,900 | 9/1990 | Frame . |
| 4,974,043 | 11/1990 | Stevens . |
| 5,114,237 | 5/1992 | Cazaux . |
| 5,196,939 | 3/1993 | Elabd et al. . |
| 5,264,939 | 11/1993 | Chang . |
| 5,272,535 | 12/1993 | Elabd . |
| 5,442,208 | 8/1995 | Bosiers et al. . |
| 5,491,512 | 2/1996 | Itakura et al. . |
| 5,510,836 | 4/1996 | Stekelenburg . |
| 5,614,740 | 3/1997 | Gardner et al. . |
| 5,811,845 | 9/1998 | Isons et al. .............................. 257/256 |
| 5,892,251 | 4/1999 | Kumesawa et al. ..................... 257/239 |

FOREIGN PATENT DOCUMENTS 5-37861  2/1993  Japan .

*Primary Examiner*—Ngân V. Ngô
*Attorney, Agent, or Firm*—Banner & Witcoff, Ltd.

[57] ABSTRACT

A CCD sensor includes a readout register formed in substrate, the readout register including a channel, a bus structure and a connection structure. The bus structure includes plural spaced element sets, each element set including a first clock conductor. The first clock conductor of a first element set is a dual function conductor. The connection structure isolates the dual function conductor while coupling together the first clock conductor of each other set of the element sets. Alternatively, the sensor includes vertical and readout registers formed in a well in a substrate. The vertical register includes a vertical channel, a vertical bus structure and a vertical connection structure, and the readout register includes a readout channel, a readout bus structure and a readout connection structure. The readout bus structure includes plural spaced readout element sets, each readout element set including a first readout clock conductor. The first readout clock conductor of a first readout element set is a dual function readout clock conductor. The readout connection structure isolates the dual function readout clock conductor while coupling together the first readout clock conductor of each other set of the readout element sets. The vertical bus structure includes plural spaced vertical element sets, each vertical element set including a first vertical clock conductor. The first vertical clock conductor of a first vertical element set is a dual function vertical clock conductor. The vertical connection structure isolates the dual function vertical clock conductor while coupling together the first vertical clock conductor of each other set of the vertical element sets.

19 Claims, 7 Drawing Sheets

SELECTABLE RESOLUTION CCD SENSOR

This application is a continuation-in-part application of Ser. No. 09/006,888 filed Jan. 14, 1998.

BACKGROUND OF THE INVENTION

1. Field of the Invention

The present invention relates to selectable resolution in a CCD imaging sensor. In particular, the invention relates to use of a dual function clock conductor in the clocking structure to mechanize a two dimensional selectable resolution feature in area and TDI sensors and a one dimensional selectable resolution feature in the readout register of the sensor and in one dimensional linear sensors.

2. Description of Related Art

Charge coupled devices (hereinafter CCDs) are widely used in video imaging and recording applications. For example, the architecture of a CCD video sensor may follow the form dictated by the National Television Standards Committee (NTSC) for video broadcast standards. Such CCD video sensor designs need at least 488 TV lines vertically, 500 to 800 pixels per TV line, have an optical format of 4/3 aspect ratio, and generate field interlaced video at a frame rate of 30 Hz. CCD architectures which achieved the goals of the video format imaging requirements generally fall into two categories: Interline Transfer (ILT) or Frame Transfer (FT) image sensors.

An alternative application of a CCD sensor is industrial inspection or vision equipment. The architecture of a CCD video sensor for this application may be optimized for maximum pixel resolution, or to maximize image frame rate, or both. Often inspection cameras used to inspect moving objects (e.g., on a continuous conveyor belt or rolled goods such as rolls of cloth) employ a line scan CCD sensor where a linear CCD sensor is oriented in a direction perpendicular to the direction of movement of the object being imaged. Advanced linear CCD sensors often employ a time delay and integrate technology and are referred to as TDI CCD sensors.

In FIG. 7, known frame transfer sensor 10 includes imaging section 2 coupled to storage section 4. Frame transfer sensors rely on the quick transfer of image field data from an array of photo-sensitive photo-sites in imaging section 2 where photo-charge is integrated (i.e., the imaging section) to an optically opaque analog storage array (i.e., storage section 4), and the subsequent parallel to serial transfer of the video data through horizontal CCD readout shift register 6 (HCCD shift register) through output node structure 7, through buffer 8 to a camera circuit. An optically opaque storage array is a storage array that is covered by an optically opaque material such as an aluminum film so that the storage array is not photo-sensitive. The rapid vertical transfer of the image data from integration of the first video field is vital since the optical input onto the imaging section of the CCD sensor is continuous (not strobed or modulated during transfer).

In FIG. 8, known interline transfer CCD image sensor 20 (i.e., an ILT CCD sensor) includes imaging section 12 in a plurality of columns of photo-sites, each column disposed adjacent to an optically opaque interline transfer register 14 (e.g., covered with aluminum to render the transfer register insensitive to optical input). An ILT CCD sensor generally has no optically opaque storage section as does the frame transfer sensor. In an ILT CCD sensor, optical input is integrated in photo-sites 12 and then transferred to interline transfer registers 14. Then, during the integration of the next field of data, the field of image data in interline transfer registers 14 are parallel to serial transferred through horizontal CCD shift register 16 (HCCD shift register) through output node structure 17, through buffer 18 to a camera circuit.

In FIG. 9, known time delay and integrate (TDI) linear array sensor 30 includes imaging section 22 as in a frame transfer sensor, but the imaging section is generally coupled directly to horizontal CCD readout shift register 26, and from there through output node structure 27, through buffer 28 to a camera circuit. Imaging section 22 includes a plurality of columns, each column including a plurality of photo-sites. In operation, a camera lens focuses the image on the TDI CCD sensor. The image, that is the optical input to the TDI CCD sensor, is moving (e.g., on a conveyor belt). An image conjugate focused on the sensor appears to be moving. A portion of the image first appears on one pixel of the TDI CCD sensor, and then appears on another pixel of the sensor. The camera and sensor are arranged so that a portion of the moving image moves in a direction from the top of a column of photo-sites to the bottom of the column. The TDI CCD sensor is clocked to transfer charge down the columns of photo-sites at a rate equal to the rate that the portion of the image moves down the column. Charge generated at a first photo-site is transferred to the next photo-site at the same time that the image portion that generated the charge at the first photo-site moves to the next photo-site. In this way photo-charge is accumulated at the photo-site under the image portion as the image portion moves down the column. Thus the name, time delay and integrate (TDI).

Two-dimensional imaging arrays (e.g., in frame transfer sensors and in interline transfer sensors) generally take a snap shot of an image. The whole photo-active array of pixels integrates photo-charge for a period of time. At the end of the integration time, the information is transferred from the sensor to an external circuit element using a parallel to serial transfer scheme. Each horizontal line of pixel data is transferred into a horizontal CCD readout shift register. The line of data is then transferred serially through an output node structure at the end of the register and then through a buffer amplifier.

Similarly, in a TDI CCD sensor, the last pixel in each integrating column of photo-sites (i.e., the last horizontal line) is transferred into a horizontal CCD readout shift register. The line of data is then transferred serially through an output node structure at the end of the register and then through a buffer amplifier.

In TDI CCD sensors, it is sometimes desirable to adjust the responsivity of the sensor to the brightness of the light illuminating the scene being imaged. In applications of two dimensional imaging arrays (e.g., in frame transfer sensors and in interline transfer sensors), it is sometimes desirable to provide a reduced format sensor (i.e., only the lower half or quarter of the image area is output). In applications of two-imensional imaging arrays (e.g., in frame transfer sensors and in interline transfer sensors) or in a TDI sensor, it is sometimes desirable to provide a selectable resolution in the horizontal direction (i.e., only the right or left half or quarter of the image area is output). In one dimensional line scan applications, it is sometimes desirable to provide a one dimensional selectable resolution in the horizontal direction (i.e., only the right or left half or quarter of the line array is output).

SUMMARY OF THE INVENTION

It is an object to the present invention to provide a structure to achieve a two dimensional selectable resolution CCD sensor. It is another object of the present invention to provide means for externally programmable format horizontal resolution selection for a frame transfer or interline transfer CCD sensor, for TDI sensors, and for one dimensional line scan sensors.

These and other objects are achieved with a CCD sensor that includes a readout register formed in substrate, the readout register including a channel formed in the substrate, a bus structure and a connection structure. The bus structure includes plural spaced register element sets. Each register element set includes a first clock conductor and at least one other clock conductor. The first clock conductor of a first register element set is a dual function conductor. The connection structure isolates the dual function conductor while coupling together the first clock conductor of each other set of the register element sets.

In an alternative embodiment, a CCD sensor includes a vertical register and a readout register formed in a well, the well being formed in a substrate. The vertical register includes a vertical channel formed in the well, a vertical bus structure and a vertical connection structure. The readout register includes a readout channel formed in the well, a readout bus structure and a readout connection structure. The readout bus structure includes plural spaced readout register element sets, each readout register element set including a first readout clock conductor and at least one other readout clock conductor. The first readout clock conductor of a first readout register element set is a dual function readout clock conductor. The readout connection structure isolates the dual function readout clock conductor while coupling together the first readout clock conductor of each other set of the readout register element sets. Similarly, the vertical bus structure includes plural spaced vertical register element sets, each vertical register element set including a first vertical clock conductor and at least one other vertical clock conductor. The first vertical clock conductor of a first vertical register element set is a dual function vertical clock conductor. The vertical connection structure isolates the dual function vertical clock conductor while coupling together the first vertical clock conductor of each other set of the vertical register element sets.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Figure 1:
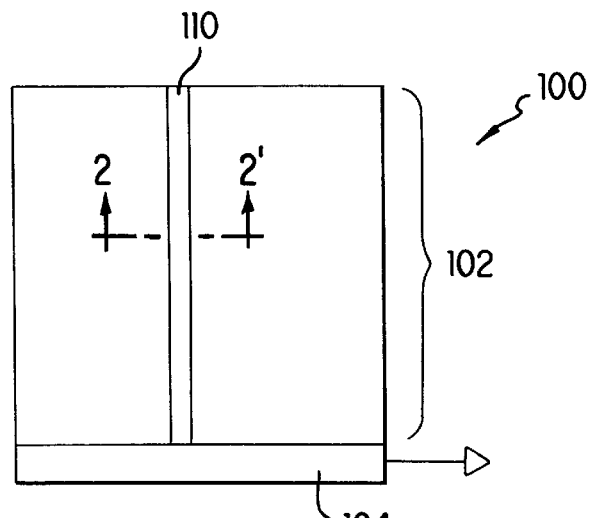
FIG. 1 is a layout diagram of the present invention.

In FIG. 1, CCD sensor 100 includes horizontal readout register 104 and imaging section 102 in which channel structure 110 has been formed. FIG. 1 depicts the location of channel structure cross section 2-2' which is shown in FIG. 2.

Figure 2:
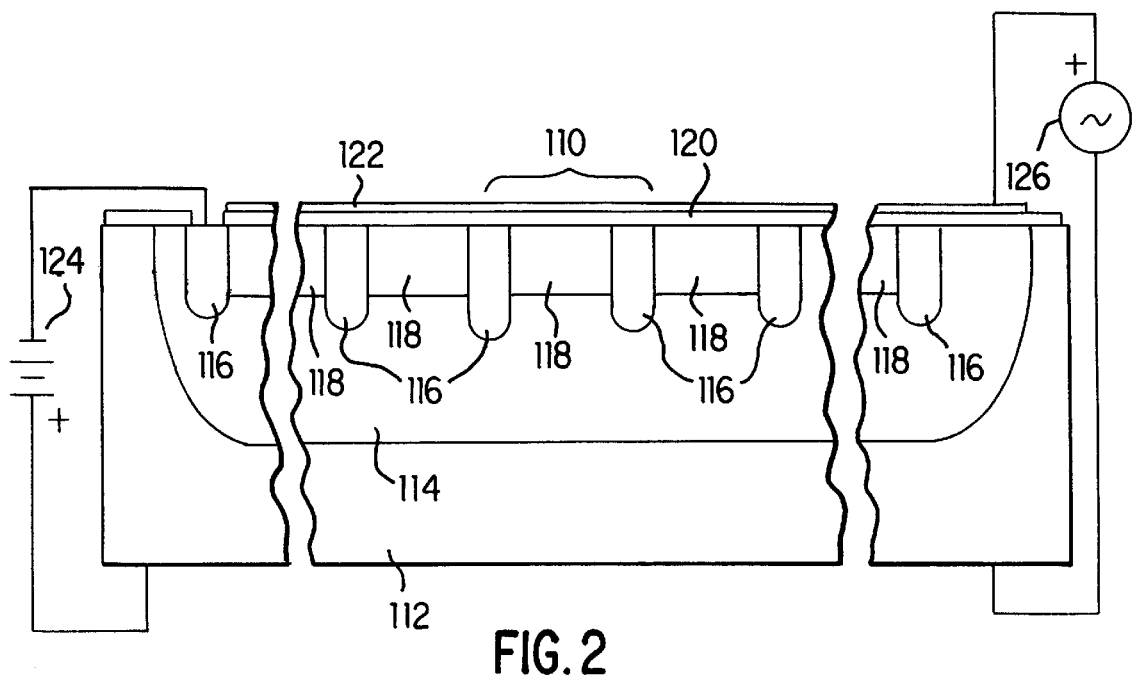
FIG. 2 is a section diagram through the diagram of FIG. 1.

In FIG. 2, well 114 (e.g., formed of a P⁻ semiconductor conductivity type) is formed in semiconductor substrate 112 (e.g., formed of an N semiconductor conductivity type). A plurality of channel stops 116 (e.g., formed of a P⁺ semiconductor conductivity type) are formed longitudinally in a surface semiconductor region (e.g., formed of a N⁻ semiconductor conductivity type) that is formed in well 114 so as to define a plurality of longitudinal channels 118 (e.g., formed of the surface semiconductor region of N⁻ semiconductor conductivity type) disposed between respective channel stops 116. Bias potential 124 is applied between substrate 112 and well 114 to reverse bias the electrical junction there between. Potential is applied through channel stops 116 or directly by contact to well 114. In either case, channel stops 116 are of the same conductivity type as well 114 so that the channel stops and the well are in electrical communication. Channels 118 are biased to be reverse biased from well 114 so that channels 118 are electrically isolated from each other and from the well and from the channel stops. Insulator 120 is formed over the channels, the channel stops and the well to surround the channels with either an insulator or a reverse biased semiconductor junction. Clock bus structure 122 is formed over insulator 120. Clock signal source 126 provides clock signals to clock bus structure 122.

Figure 3:
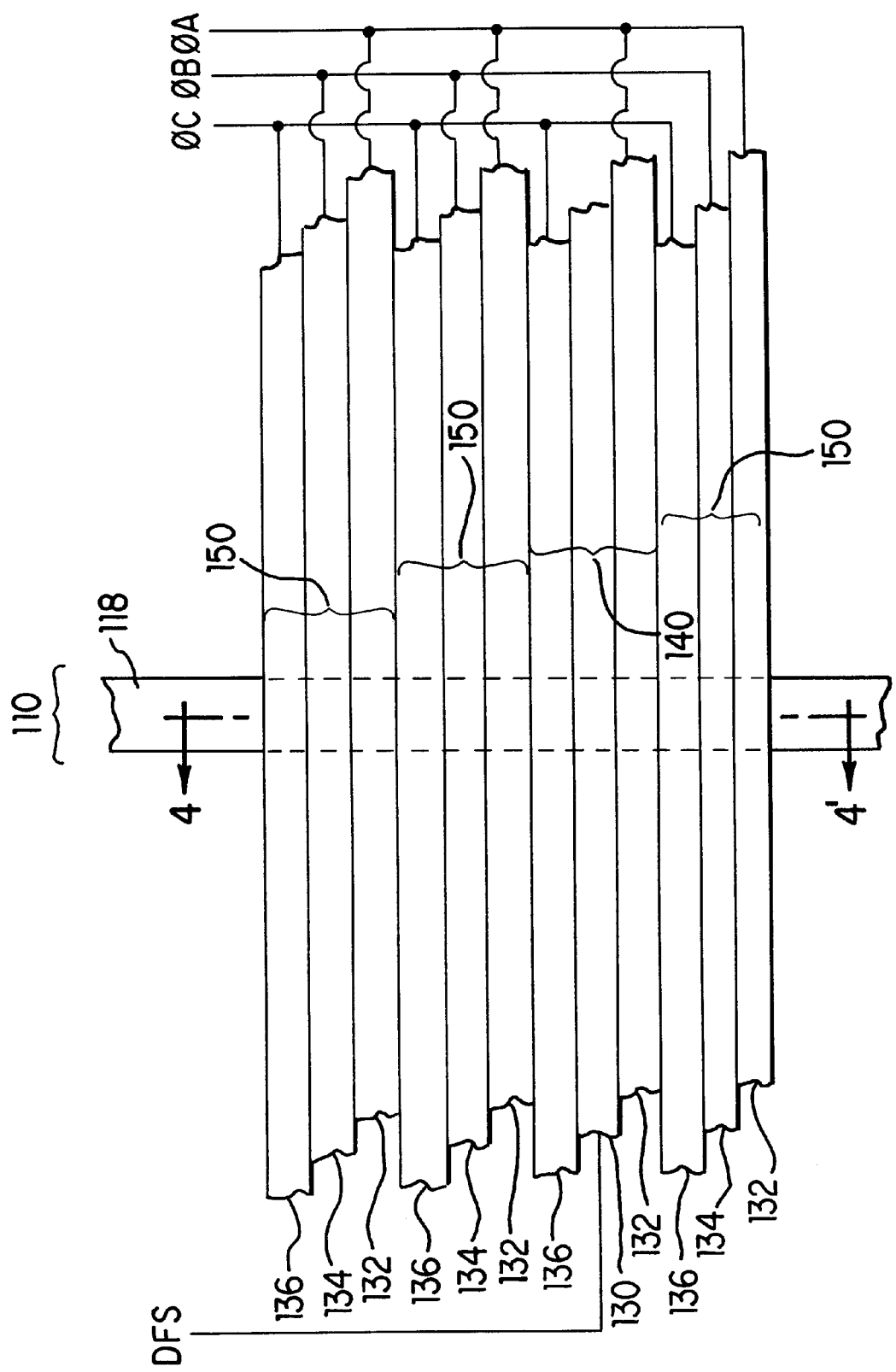
FIG. 3 is a plan view of a central portion of the diagram of FIG. 1.

FIG. 3 depicts a plan view of the clock bus structure 122 disposed over channels 118 and oriented transversely to the channel direction. In one embodiment, channel 118 (in FIGS. 3 and 4) represents a vertical CCD shift register channel in the imaging section 102 of FIG. 1. In an alternative embodiment, channel 118 (in FIGS. 3 and 4) represents a horizontal readout CCD shift register channel in readout register 104 of FIG. 1. Clock bus structure 122 includes a plurality of uniformly spaced register element sets including first register element set 140 and a plurality of remaining register element sets 150. Each register element set includes a plurality of clock signal conductors: two conductors for two phase clocking, three conductors for three phase clocking, four conductors for four phase clocking, etc. The clock signal conductors are preferably formed of conductively doped poly-crystalline silicon (hereinafter poly) insulated from adjacent conductors by known means.

Figure 4:
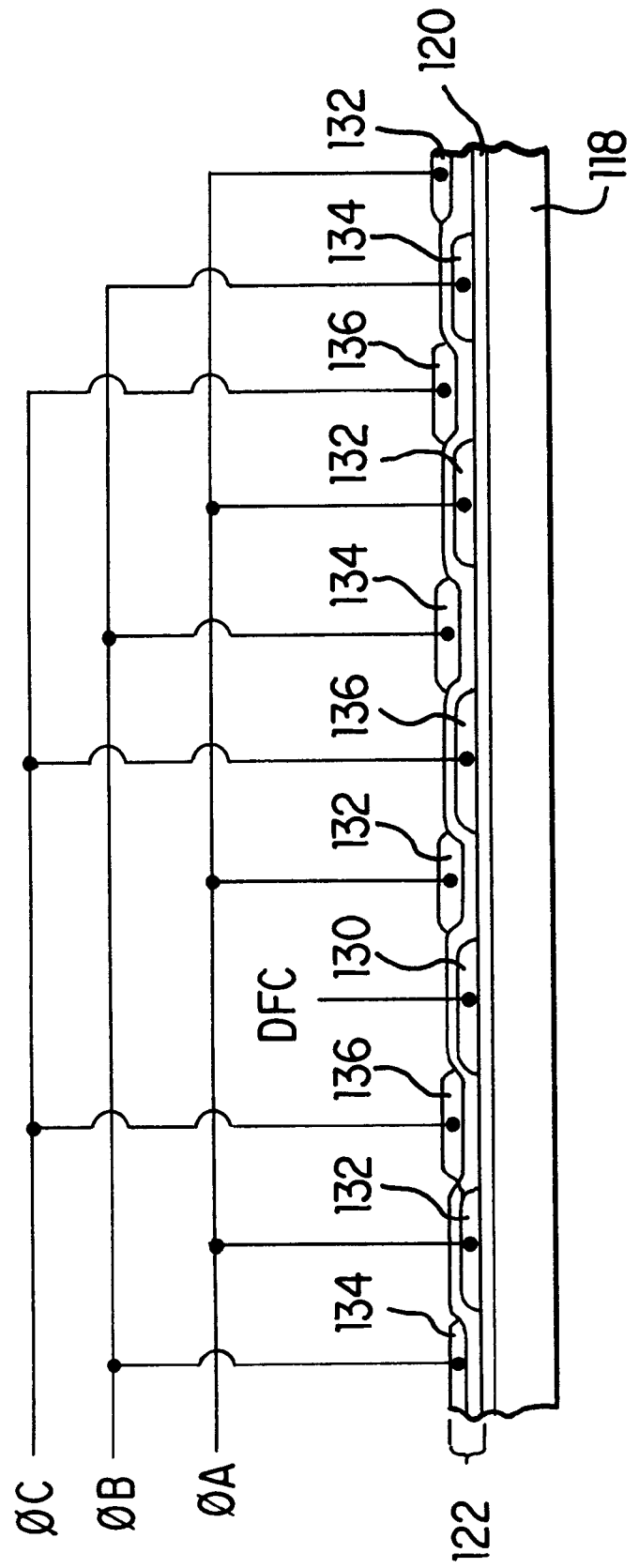
FIG. 4 is a section diagram through the diagram of FIG. 3.

In FIGS. 3 and 4, first register element set 140 includes dual function signal conductor 130 as a first clock signal conductor coupled to dual function signal DFS and at least one other clock signal conductor, for example, clock signal conductor 132 and clock signal conductor 136 coupled to clock signals φA and φC, respectively, to form a three phase clocking structure. Alternatively, first register element set 140 may include dual function signal conductor 130 as a first clock signal conductor and only one other clock signal conductor to form a two phase clocking structure or it may include three or more clock signal conductors to form other multi-phase clocking structures.

Each remaining register element set of the plurality of remaining register element sets 150 includes first clock signal conductor 134 coupled to clock signal φB. Furthermore, each remaining register element set of the plurality of remaining register element sets 150 includes at least one other clock signal conductor (for example, a first additional clock signal conductor 132, and another additional clock signal conductor 136 coupled to clock signals φA and φC, respectively). Equivalent structures for two and four phase clocking structures are envisioned.

The connection structure to couple clock signals φA, φB and φC and dual function signal DFS to clock bus structure 122 includes a connection to couple together first clock signal conductor 134 of each of the plurality of remaining register element sets 150 so as to carry clock signal φB. However, first clock signal conductor 130 (i.e., the dual function signal conductor) of first register element set 140 is not connected to any first clock signal conductor 134 of any of the plurality of remaining register element sets 150 so that conductor 130 can carry signal DFS and be electrically isolated from signal φB. The connection structure further includes a connection to couple each clock signal conductor of the at least one other clock signal conductor of the first register element set to respective clock signal conductors of each set of the plurality of remaining register element sets.

The plurality of remaining register element sets 150 may be regarded as including a first remaining set and a second remaining set, where first register element set 140 is disposed between the first remaining set and the second remaining set.

The CCD sensor is fabricated in a wafer and then cut or otherwise trimmed to form a die. At the edge of the die are disposed a number of terminals (e.g., aluminum pads) to which small wires are bonded to make external connections. A CCD sensor includes a first die terminal coupled to first clock signal conductor 134 of each of the plurality of remaining register element sets 150 and a dual function die terminal coupled to first clock signal conductor 130 of first register element set 140. The CCD sensor also includes a respective other die terminals for each clock signal conductor of the at least one other clock signal conductor of first register element set 140, where each respective other die terminal is coupled to (1) a corresponding clock signal conductor of each set of the plurality of remaining register element sets 150 and (2) a corresponding clock signal conductor of first register element set 140.

A first clock signal source provides first clock signal φB to first clock signal conductor 134 of each of the plurality of remaining register element sets 150. The first clock signal φB is characterized by a clock selectable value, the clock selectable value being one of a clock high value (e.g., +5 volts) and a clock low value (e.g., 0 volts).

However, a dual function signal source provides dual function signal DFS to first clock signal conductor 130 of first register element set 140. The dual function signal DFS is characterized by a dual function selectable value, the dual function selectable value being one of the clock high value (e.g., +5 volts), the clock low value (e.g., 0 volts) and a barrier value (e.g., −3 volts) so that the clock low value is a value between the clock high value and the barrier value.

Figure 5:
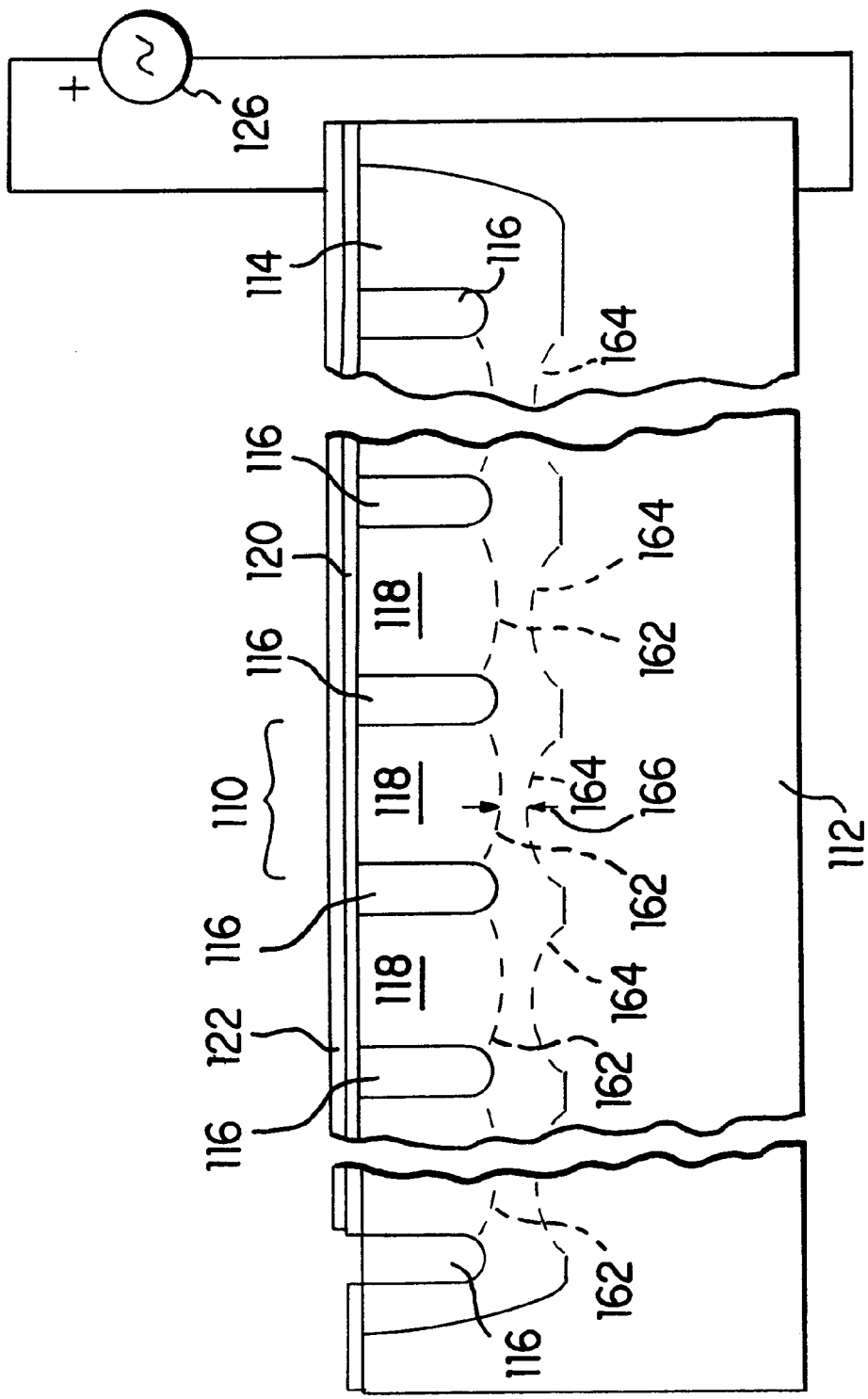
FIG. 5 is a section diagram through the diagram of FIG. 1 similar to FIG. 2, but showing electrical junctions.

In FIG. 5, a first electrical junction is defined at an electrical semiconductor junction between the channel and the well (162 of FIG. 5), and a second electrical junction (164 of FIG. 5) is defined at an electrical semiconductor junction between the well and the substrate. An inter-junction separation (166 of FIG. 5) under first clock signal conductor 130 (i.e., the dual function signal conductor) of first register element set 140 is defined between the first and second electrical junctions. A length of the inter-junction separation is controllable by the dual function selectable value. The length of the inter-junction separation is zero when the dual function selectable value is the barrier value. When the dual function selectable value is the clock high value (e.g., +5 volts), a potential well is formed under the dual function signal conductor suitable for storing a maximum design signal charge. When the dual function selectable value is the clock low value (e.g., 0 volts), a potential well of minimal capacity is formed under the dual function signal conductor, the minimal capacity well being suitable for acting as a barrier to hold charge packets in a well under an adjacent clock conductor by storing only a minimum signal charge.

Clock phase signals φA, φB and φC are controlled to alternate between the clock high value and the clock low value to transfer charge in the channel direction down the channel. Even dual function signal DFS alternates between the clock high value and the clock low value to transfer charge in the channel direction down the channel when the present control structure is operating in a clocking mode. Since the register element sets and conductors within the register element sets are uniformly disposed, a charge packet being transferred down the channel will not be able to detect whether it is dual function signal conductor 130 of first register element set 140 or first clock signal conductor 134 of any set of the plurality of remaining register element sets 150 that is controlling the transfer.

However, when the present control structure is operating in a shunt mode, dual function signal DFS has a value equal to the barrier value (e.g., −3 volts), and the inter-junction separation diminishes to zero so that the channel becomes in electrical communication with the substrate. Signal charge carried in the channel is then shunted into the substrate.

Figure 6:
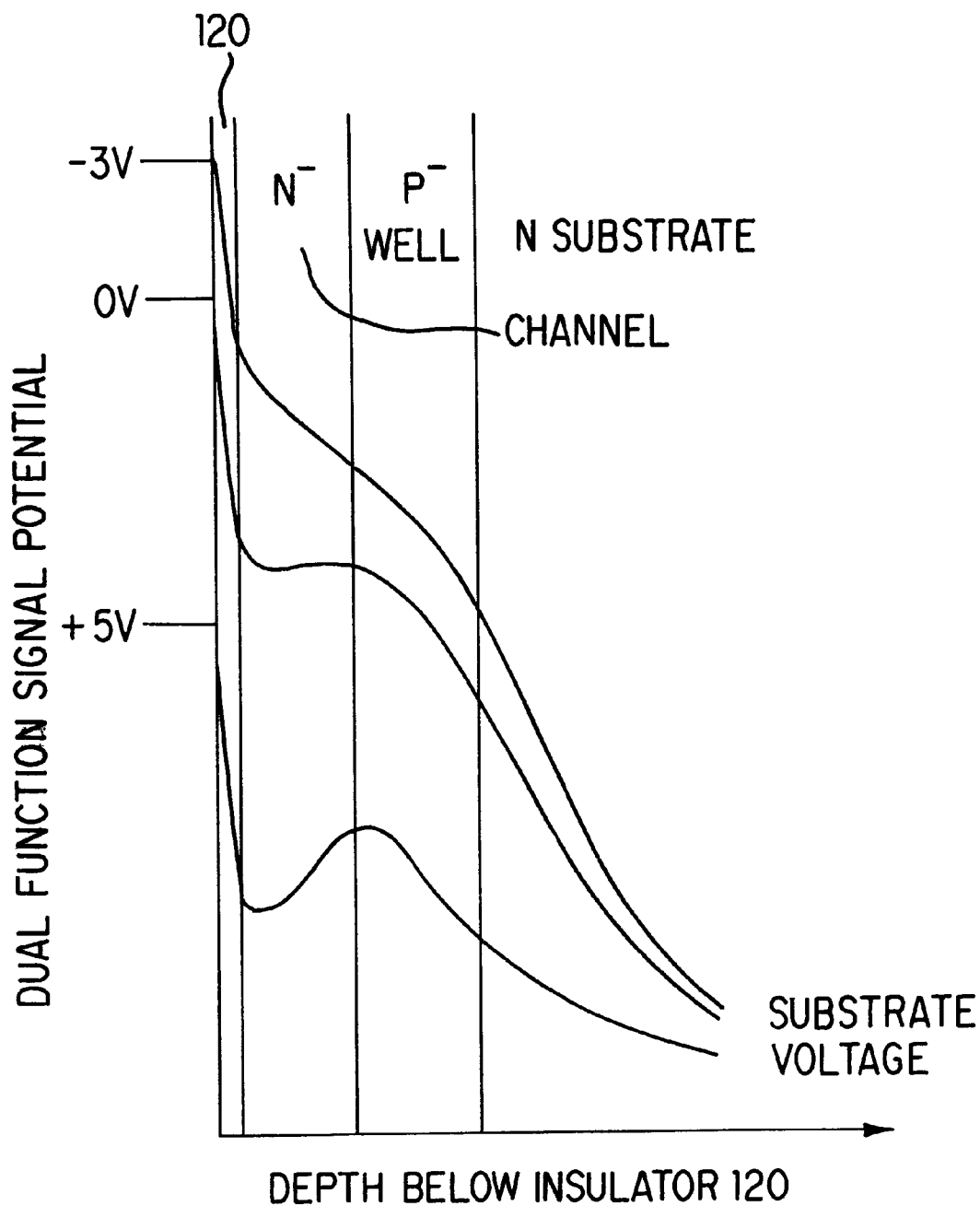
FIG. 6 is a graph depicting the relationship between the depth below dual function signal conductor 130 and the potential at that depth for three signal levels applied to dual function signal conductor 130.
Figure 7:
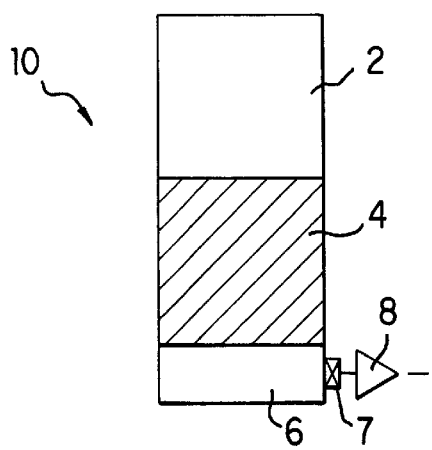
FIGS. 7–9 are layout diagrams of known sensor layouts.
Figure 8:
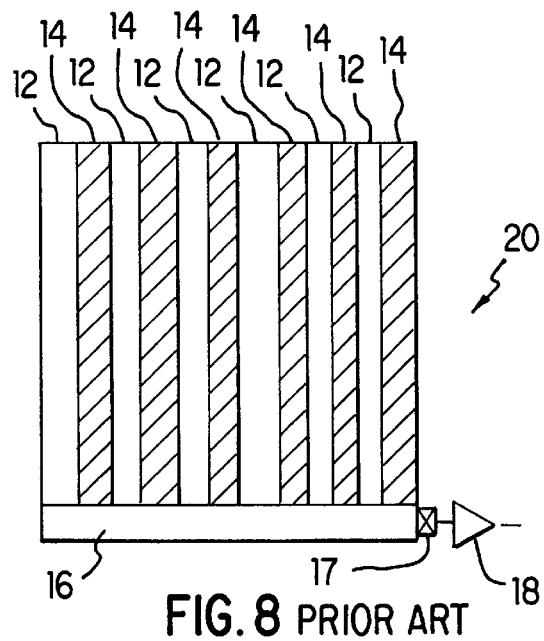
Figure 9:
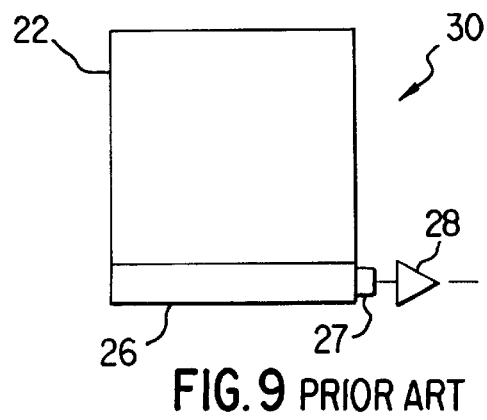

FIG. 6 is a graph of the relationship between the depth below dual function signal conductor 130 and the potential at that depth for three signal levels applied to dual function signal conductor 130: the clock high value (e.g., +5 volts), the clock low value (e.g., 0 volts) and a barrier value (e.g., −3 volts). When the clock high value is applied, a design maximum capacity well is formed as depicted in FIG. 6 as a dip in the potential within the channel depths. A local potential peak exists at the boundary between the channel and the well that acts as barrier to keep charges (e.g., electrons) from migrating into the substrate. This well (i.e., the dip) can hold charges (e.g., electrons) until sufficient charge is accumulated to make the potential in the channel more negative than the local peak of the barrier. Then, the excess charge overflows (e.g., blooms over) the local barrier and transfers into the substrate.

When the clock low value (e.g., 0 volts) is applied, a minimum capacity well is formed as depicted in FIG. 6 as a more or less flat potential zone within the channel depths. Very little, if any, charge may be held within the channel depths before the potential is sufficiently negative to overflow into the substrate.

When the barrier value (e.g., −3 volts) is applied, no charge may be held in the channel depths. As depicted in FIG. 6 as a sloped potential zone within the channel depths, an electric field exists to accelerate charge into the substrate.

To help ensure that inter-junction separation 166 (FIG. 5) is minimum at channel centers, the concentration of the dopant species used to define well 114 (FIG. 2) is thinned near the centers of each channel. This gives rise to the inter-junction separation 166 being minimum near the center of the channel and maximum near channel stops 116. Then, when the barrier value (e.g., −3 volts) is applied to dual function signal conductor 130, inter-junction separation 166 (FIG. 5) becomes zero as electrical junctions 162 and 164 make contact and charge is free to transfer from channel 118 into substrate 112 (FIG. 5) under the influence of the electrical field produced by the potential gradient (i.e., slope) depicted in the channel depths in FIG. 6.

In accordance with these teachings, a CCD sensor control structure may be constructed to operate in either a clocking mode or a shunt mode. When the control structure operates in a clocking mode, the CCD sensor operates conventionally. A TDI CCD sensor integrates all of the vertical pixels before transfer to horizontal readout structure 104, and a frame transfer CCD sensor (or an interline transfer CCD sensor) transfers all of the frame image to horizontal readout structure 104 (FIG. 1).

However, when the control structure operates in a shunt mode, the CCD sensor operates differently. A TDI CCD sensor in the shunt mode integrates only as many of the vertical pixels that exist between dual function signal conductor 130 and horizontal readout structure 104, other pixels being clocked into a well beneath dual function signal conductor 130 and shunted to the substrate. In this way, the responsivity of the TDI CCD sensor may be electrically adjusted to adapt to changes in illumination conditions. In fact, multiple dual function signal conductors 130, according to these teaching, may be included in the TDI CCD sensor to provide a range of selectable responsiveness to illumination. For example, two dual function signal conductors 130 may be utilized to provide full, half or one-quarter the sensitivity to light.

A frame transfer CCD sensor (or an interline transfer CCD sensor) transfers only those pixels that exist between dual function signal conductor 130 and horizontal readout structure 104, other pixels being clocked into a well beneath dual function signal conductor 130 and shunted to the substrate. Such a structure may be used to form small images (fewer pixels) at faster rates.

Figure 10:
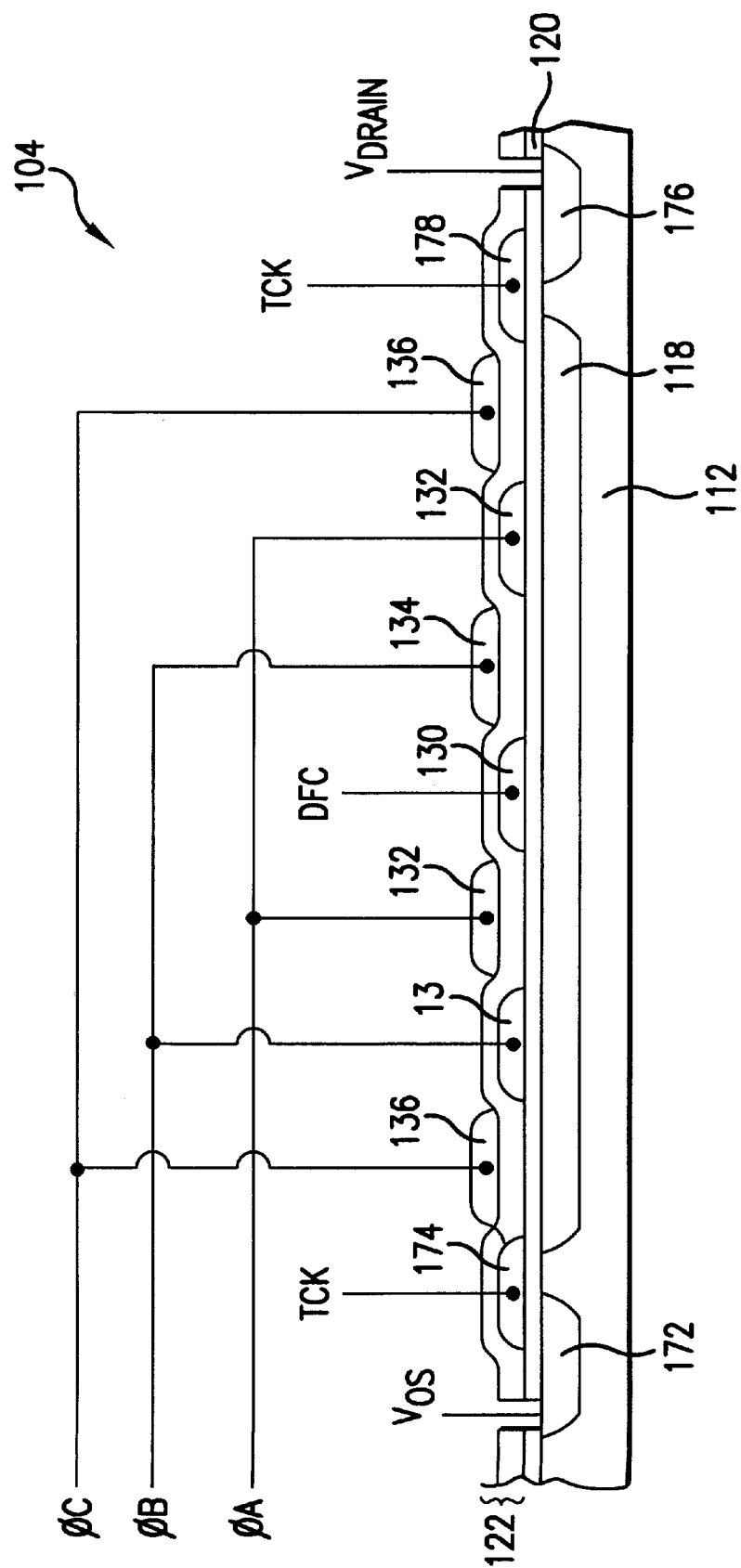
FIG. 10 is a section diagram of an alternative embodiment of the present invention.

FIG. 10 depicts an alternative embodiment of horizontal readout register 104 (as shown in FIG. 1). FIG. 10 is a section view through a longitudinal section of readout register 104. In FIG. 10, substrate 112 is of a first conductivity type (e.g., P⁻) and channel 118 is of a second conductivity type (e.g. N⁻). Alternatively, but not shown, substrate 112 could be formed of the second conductivity type (e.g. N⁻) with well 114 of the first conductivity type (e.g., P⁻) formed in substrate 112 so that channel 118 of the second conductivity type (e.g. N⁻) is formed in well 114 as depicted in FIG. 2.

In FIG. 10, readout register 104 includes readout node 172 spaced apart from, of a same conductivity type as, and at a first end of channel 118. Readout node 172 is formed of the second conductivity type (e.g. N⁻) in substrate 112 that is formed of the first conductivity type (e.g., P⁻). The concentration of dopant species in readout node 172 is preferably high compared to the concentration of dopant species in channel 118 so that readout node 172 will make a good quality ohmic contact with any conductor leading away from readout node 172. Transfer gate electrode 174 is preferably formed of doped poly-crystalline silicon. When transfer clock TCK of a suitable potential is applied to electrode 174, a surface channel is formed beneath electrode 174 through which signal charge from channel 118 is transferred into node 172 that produces output signal $V_{OS}$. Node 172 and electrode 174, together with a reset structure (not shown), form the output structure for readout register 104.

In FIG. 10, readout register 104 also includes drain 176 spaced apart from, of a same conductivity type as, and at a second end of channel 118. Drain 176 if formed, like readout node 172, of the second conductivity type (e.g. N⁻) in substrate 112 that is formed of the first conductivity type (e.g., P⁻). A positive potential $V_{DRAIN}$ (e.g., 5 volts) is applied to drain 176. Transfer gate electrode 178 is preferably formed of doped poly-crystalline silicon. When transfer clock TCK of a suitable potential is applied to electrode 178, a surface channel is formed beneath electrode 178 through which signal charge from channel 118 can be transferred into drain 176. Remaining features depicted in FIG. 10 are the same as corresponding features depicted in FIG. 4.

The embodiment depicted in FIG. 10 may operate in a long mode and a short mode. In the long mode, dual function clock DFC is clocked between the same voltages as, and synchronous with, phase C clock φC, and the transfer clock TCK is clocked between the same voltages as and synchronous with phase A clock φA. In this way, the entire length of the shift register formed with channel 118 is serially shifted into readout node 172.

In the short mode, dual function clock DFC is given a negative potential (e.g., −3 volts) that is applied to gate electrode 130. This sets up a barrier across channel 118 beyond which signal charge cannot be transferred. A shortened register containing signal charge between electrode 130 and node 172 is formed. Signal charges between electrode 130 and node 172 are clocked normally by clock signals φA, φB and φC. However, signal charges between drain 176 and electrode 130 are unable to pass the barrier caused by the negative potential on electrode 130 even when clocked by clock signals φA, φB and φC. Signal charges pile up in the well under the last clock electrode before electrode 130 and are held in place by the barrier under electrode 130 and two channel stops (not shown) on either side of channel 118. When sufficient signal charges pile up, the signal potential in the well under the last clock electrode before electrode 130 becomes sufficiently negative that the last clocking signal ceases to affect a charge transfer function. The excess charge then back flows into the adjacent well. As charge continues to pile up and all wells are filled with excess signal charge while confined by the adjacent channel stops and the barrier under electrode 130, a back flow current of excess signal charge is transferred into drain 178 and from there removed.

Providing dual function electrode 130 at the center of readout register 104 permits the number of horizontal resolution elements in the sensor to be selectively changed for N (long mode) to N/2 (short mode). A single sensor can be manufactured, stockpiled and then used in differing applications requiring different horizontal resolutions. In fact, several dual function electrodes 130 can be provided to achieve plural selectable horizontal resolutions. For example, if the sensor is designed for 512 pixel resolution in the long mode, seven evenly spaced dual function electrodes 130 can be provided to provide selectable horizontal resolution in 64 pixel steps.

One type of known sensor provides a symmetrically split readout register where signal charge in one-half of the register is shifted to an output structure at one end (e.g., on the left), and signal charge in the other half of the register is shifted to an output structure at the other end (e.g., on the right). To do this, the clocking structure (i.e., the clocking conductors and connections) must be split to support shifting one direction in one half of the register and shifting an opposite direction in the other half of the register.

The novel readout register 104 depicted in FIG. 10 is strikingly similar to known symmetrically split readout registers when drain 176 and transfer electrode 178 are used as part of an output structure. However, unlike known split readout registers, readout register 104 includes (1) dual function electrode 130 disposed between the two symmetric halves of the readout register, (2) a clocking structure where the clocking structure of unselected parts of the register need not clock the register at all or need not clock the register in a direction symmetrically opposite to the direction of the selected part, and (3) a clocking structure that is capable of clocking the entire register toward the output structure when operating in the long mode. The inclusion of electrically isolated dual function electrode 130 permits a potential barrier to be selectively formed under control of an external source (e.g., a signal from outside of the CCD sensor chip). In this way, a single sensor design may be manufactured that can be controlled by an external source to have selectable resolution.

In an alternative embodiment a side transfer drain structure is provided in a gap in a side channel stop adjacent to the well under the last clock electrode before dual function electrode 130. The side transfer drain structure includes a side drain like drain 166 (except along side of the channel 118) and a side transfer gate electrode like transfer gate electrode 178 that forms a surface channel in the gap in the side channel stop to connect channel 118 with the side drain when a suitable transfer potential is applied to the side transfer gate electrode. Plural such side transfer drain structures may be provided when plural dual function electrodes 130 are provided to affect a selectable resolution horizontal readout structure.

Combinations of horizontal and vertical stage selections are possible. The vertical stage selection is achieved with vertical registers formed in a well, each vertical register including one or more vertical anti-blooming structures controlled by a corresponding shunt producing dual function gate electrode. The horizontal stage selection is achieved with a stage selectable horizontal readout register. The readout register may include a register formed in the well with one or more vertical anti-blooming structures controlled by a corresponding shunt producing dual function gate electrodes. Alternatively, the readout register may include a register formed in the well with an output structure at one end and a drain structure at the other end and one or more barrier producing dual function gate electrodes. Alternatively, the readout register may include a register formed in the well with an output structure at one end and one or more side drain structures adjacent to electrodes just before corresponding barrier producing dual function gate electrodes.

It should be appreciated that when a well of a particular conductivity type is used, whether or not vertical antiblooming structures are employed, the conductivity type of the well is opposite to the conductivity type of both the channel and the substrate. For example, a channel may be commonly formed of an N type conductivity. Therefore, if a well is used, it is of a P type conductivity, and the substrate is of the N type conductivity. If stage selection using a vertical anti-blooming structure is used in the vertical registers, a well is required in the vertical register portion of the sensor, and the conductivity type of the substrate is the same as the conductivity type of the substrate.

If horizontal stage selection is provided in the same sensor, it must use a horizontal channel formed in a well so that the horizontal channel can be isolated from the substrate by the intervening well since the horizontal channels is of the same conductivity type as a vertical channel and since both the horizontal channel and the substrate are of the same conductivity type.

On the other hand if vertical stage selection with an anti-blooming structure is not to be provided, the CCD sensor need not have a well disposed between the channel and the substrate. The horizontal readout register may be formed from an N type conductivity channel in a P type conductivity substrate. In an embodiment where the sensor includes horizontal stage selection without including vertical stage selection, the horizontal stage selection may be achieved with a stage selectable horizontal readout register formed with or without a well.

The readout register may include a register channel formed in a well, that is formed in the substrate, with an output structure at one end and either (1) a drain structure at the other end and one or more barrier producing dual function gate electrodes in between, or (2) one or more side drain structures adjacent to electrodes just before corresponding barrier producing dual function gate electrodes. Alternatively, the readout register may include a register channel formed directly in a substrate with an output structure at one end and either (1) a drain structure at the other end and one or more barrier producing dual function gate electrodes in between, or (2) one or more side drain structures adjacent to electrodes just before corresponding barrier producing dual function gate electrodes.

In accordance with the teachings above, a CCD sensor may be manufactured with selectable resolution in two dimensions. Cameras that include such selectable resolution CCD sensors may employ optical lenses to magnify or de-magnify the desired scene so that a conjugate of the desired scene is focused on the selected portion of the selectable resolution CCD sensors. In frame transfer and interline transfer sensors, selectable formats (i.e., length to width ratios) may be achieved. In TDI sensors, a combination of selectable horizontal resolution and selectable sensor responsivity may be achieved.

Having described preferred embodiments of novel control structures for a selectable resolution CCD image sensor (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired to be protected by Letters Patent is set forth in the appended claims:

1. A CCD sensor comprising a first register formed in a substrate, wherein the first register includes:
    a channel formed in the substrate;
    a bus structure disposed over and oriented transversely to the channel, the bus structure including a plurality of spaced register element sets, each register element set including a first clock signal conductor and at least one other clock signal conductor; and
    a connection structure isolating the first clock signal conductor of a first register element set while coupling together the first clock signal conductor of each other set of the register element sets.

2. The sensor of claim 1, wherein:
    the first register is a readout register of the CCD sensor; and
    the first register further includes an output structure at a first end of the channel and a drain structure at a second end of the channel.

3. The sensor of claim 1, wherein:
    the first register is a readout register of the CCD sensor; and
    the first register further includes a drain structure adjacent to a potential well formed in the channel under a conductor adjacent to the first clock signal conductor of the first register element set.

4. The sensor of claim 1, wherein:

the plurality of register element sets includes a second register element set and a third register element set; and the first register element set is disposed between the second register element set and the third register element set.

5. The sensor of claim 1, wherein the connection structure couples each clock signal conductor of the at least one other clock signal conductor of the first register element set to respective clock signal conductors of each other set of the register element sets.

6. A method of using the CCD sensor of claim 1 comprising steps of:

providing a barrier signal to the first clock signal conductor of the first register element set while the first register is to be operated in a first mode; and providing a first clocking signal to the first clock signal conductor of the first register element set while the first register is to be operated in a second mode, the barrier signal being more negative than the first clocking signal.

7. A CCD sensor comprising a first register formed in a well, the well being formed in a substrate, wherein the first register includes:

a channel formed in the well;

a bus structure disposed over and oriented transversely to the channel, the bus structure including a plurality of spaced register element sets, each register element set including a first clock signal conductor and at least one other clock signal conductor; and a connection structure isolating the first clock signal conductor of a first register element set while coupling together the first clock signal conductor of each other set of the register element sets.

8. The sensor of claim 7, wherein:

the first register is a readout register of the CCD sensor; and the first register further includes an output structure at a first end of the channel and a drain structure at a second end of the channel.

9. The sensor of claim 7, wherein:

the first register is a readout register of the CCD sensor; and the first register further includes a drain structure adjacent to a potential well formed in the channel under a conductor adjacent to the first clock signal conductor of the first register element set.

10. The sensor of claim 7, wherein:

the plurality of register element sets includes a second register element set and a third register element set; and the first register element set is disposed between the second register element set and the third register element set.

11. The sensor of claim 7, wherein the connection structure couples each clock signal conductor of the at least one other clock signal conductor of the first register element set to respective clock signal conductors of each other set of the register element sets.

12. The sensor of claim 7, wherein:

the first register is a vertical register of the CCD sensor; and the sensor further includes a horizontal readout register.

13. The sensor of claim 12, wherein the horizontal readout register includes:

a readout channel formed in the well;

a readout bus structure disposed over and oriented transversely to the readout channel, the readout bus structure including a plurality of spaced readout register element sets, each readout register element set including a first readout clock signal conductor and at least one other readout clock signal conductor; and a readout connection structure isolating the first readout clock signal conductor of a first readout register element set while coupling together the first readout clock signal conductor of each other set of the readout register element sets.

14. The sensor of claim 13, wherein the horizontal readout register further includes:

an output structure at a first end of the readout channel; and a drain structure at a second end of the readout channel.

15. The sensor of claim 13, wherein the horizontal readout register further includes a drain structure adjacent to a potential well formed in the readout channel under a conductor adjacent to the first readout clock signal conductor of the first readout register element set.

16. The sensor of claim 13, wherein:

the plurality of readout register element sets includes a second readout register element set and a third readout register element set; and the first readout register element set is disposed between the second readout register element set and the third readout register element set.

17. The sensor of claim 13, wherein the readout connection structure couples each readout clock signal conductor of the at least one other readout clock signal conductor of the first readout register element set to respective readout clock signal conductors of each other set of the readout register element sets.

18. A method of using the CCD sensor of claim 7 comprising steps of:

providing a barrier signal to the first clock signal conductor of the first register element set while the first register is to be operated in a first mode; and providing a first clocking signal to the first clock signal conductor of the first register element set while the first register is to be operated in a second mode, the barrier signal being more negative than the first clocking signal.

19. A method of using the CCD sensor of claim 13 comprising steps of:

providing a vertical barrier signal to the first clock signal conductor of the first register element set while the first register is to be operated in a first vertical mode;

providing a first vertical clocking signal to the first clock signal conductor of the first register element set while the first register is to be operated in a second vertical mode, the vertical barrier signal being more negative than the first vertical clocking signal;

providing a readout barrier signal to the first readout clock signal conductor of the first readout register element set while the horizontal readout register is to be operated in a first readout mode; and providing a first readout clocking signal to the first readout clock signal conductor of the first readout register element set while the horizontal readout register is to be operated in a second readout mode, the readout barrier signal being more negative than the first readout clocking signal.

* * * * *